(12) United States Patent
Madraswala et al.

(10) Patent No.: US 10,229,057 B2
(45) Date of Patent: Mar. 12, 2019

(54) METHOD AND APPARATUS FOR AVOIDING BUS CONTENTION AFTER INITIALIZATION FAILURE

(71) Applicant: Intel Corporation, Santa Clara, CA (US)

(72) Inventors: Aliasgar S. Madraswala, Folsom, CA (US); Kristopher H. Gaewsky, El Dorado Hills, CA (US); Bharat M. Pathak, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 15/282,036

(22) Filed: Sep. 30, 2016

(65) Prior Publication Data

US 2018/0095689 A1    Apr. 5, 2018

(51) Int. Cl.
| | |
|---|---|
| G06F 12/02 | (2006.01) |
| G06F 12/06 | (2006.01) |
| G11C 16/20 | (2006.01) |
| G11C 16/34 | (2006.01) |
| G11C 11/56 | (2006.01) |
| G11C 16/04 | (2006.01) |

(52) U.S. Cl.
CPC ...... *G06F 12/0646* (2013.01); *G11C 11/5628* (2013.01); *G11C 16/20* (2013.01); *G11C 16/3459* (2013.01); *G06F 12/0246* (2013.01); *G06F 2212/1008* (2013.01); *G06F 2212/2022* (2013.01); *G11C 16/0483* (2013.01)

(58) Field of Classification Search
CPC .... G06F 3/0632; G06F 3/0679; G06F 3/0604; G06F 12/0646; G11C 11/5628; G11C 11/5642; G11C 11/5635
USPC ....................................................... 711/103
See application file for complete search history.

(56) References Cited

U.S. PATENT DOCUMENTS

2016/0321002 A1\*  11/2016  Jung ................... G06F 3/0632

OTHER PUBLICATIONS

Intel Corporation et al., "Open NAND Flash Interface Specification," Revision 4.0; Apr. 2, 2014; 315 pages.

\* cited by examiner

*Primary Examiner* — Hua J Song
(74) *Attorney, Agent, or Firm* — Alliance IP, LLC (57) ABSTRACT

In one embodiment, an apparatus comprises a storage device comprising a NAND flash memory device comprising a plurality of NAND flash memory units. The storage device is to determine that the NAND flash memory device did not pass an initialization procedure; identify a first addressing scheme that is implemented by one or more of the NAND flash memory units that initialized properly; and after the initialization procedure, instruct each of the plurality of NAND flash memory units to implement the first addressing scheme.

17 Claims, 6 Drawing Sheets

MLC ADDRESSING SCHEME

| CYCLE | DQ7 | DQ6 | DQ5 | DQ4 | DQ3 | DQ2 | DQ1 | DQ0 |
|---|---|---|---|---|---|---|---|---|
| 1 | COLUMN ADDRESS BITS ||||||||
| 2 | ||||||||
| 3 | PAGE ADDRESS BITS ||||||||
| 4 | BLOCK ADDRESS BITS ||||||||
| 5 | LA1 | LA0 | BITS ||||||
| 6 | RESERVED BITS ||||||| LA2 |

FIG. 5

SLC ADDRESSING SCHEME

| CYCLE | DQ7 | DQ6 | DQ5 | DQ4 | DQ3 | DQ2 | DQ1 | DQ0 |
|---|---|---|---|---|---|---|---|---|
| 1 | COLUMN ADDRESS BITS ||||||||
| 2 | ||||||||
| 3 | PAGE ADDRESS BITS ||||||||
| 4 | BLOCK ADDRESS BITS ||||||||
| 5 | LA2 | LA1 | LA0 | BITS |||||

METHOD AND APPARATUS FOR AVOIDING BUS CONTENTION AFTER INITIALIZATION FAILURE

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
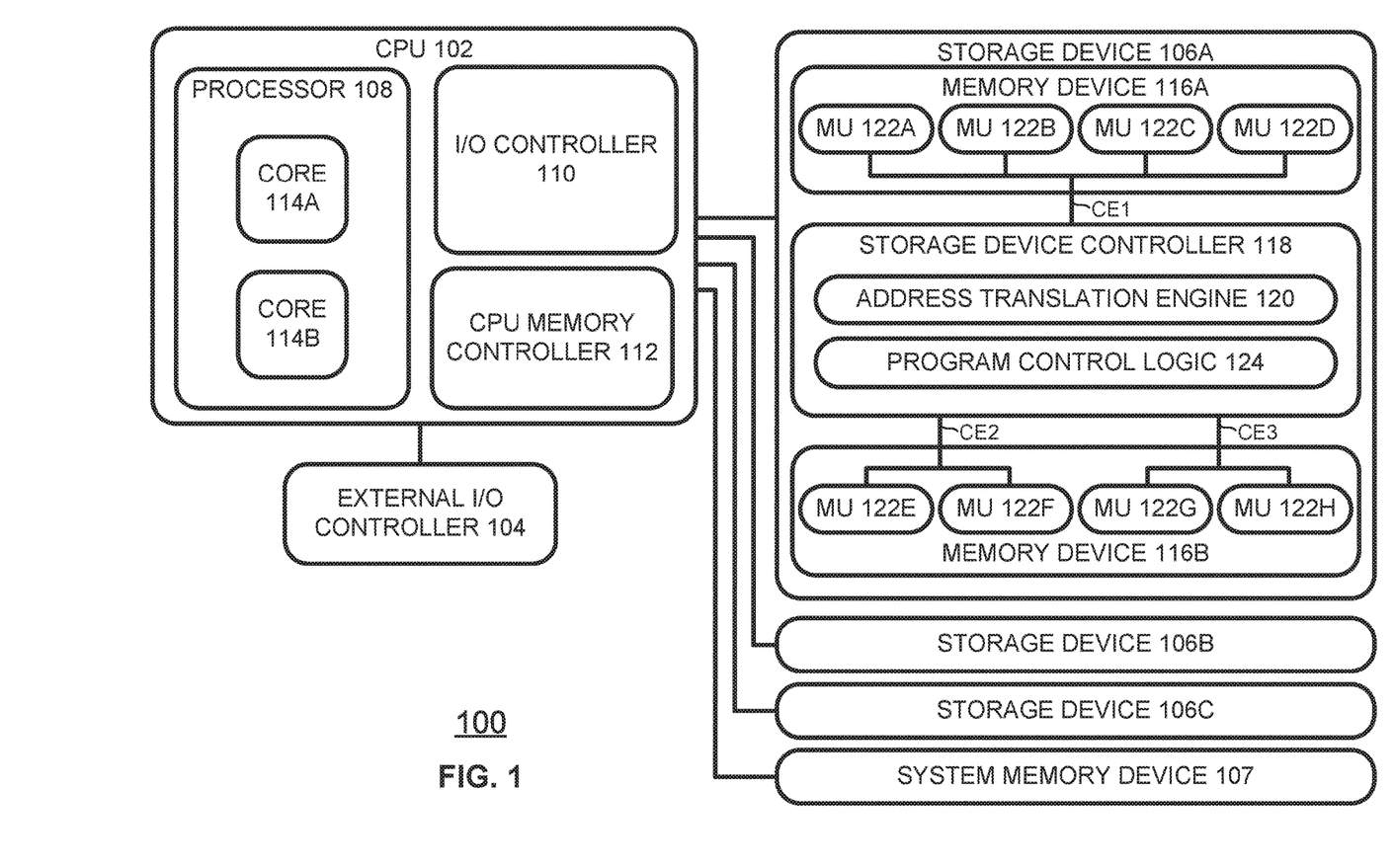
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a plurality of storage devices 106A, 106B, and 106C (storage devices 106B and 106C may perform in similar manners to storage device 106A and/or may have any suitable characteristics of storage device 106A), and system memory device 107. During operation, data may be transferred between storage device 106A or system memory device 107 and the CPU 102. In various embodiments, particular data operations (e.g., erase, program, and read operations) involving a storage device 106A or system memory device 107 may be managed by an operating system or other software application executed by processor 108.

In various embodiments, a storage device 106A comprises NAND flash memory (herein a storage device comprising NAND flash memory is referred to as a NAND flash storage device). In some embodiments, storage device 106A may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106A may include any number of memory devices 116 (herein memory device 116 may be used to refer to either memory device 116A or 116B or a similar memory device) and each memory device 116 may include any number of memory units 122 (memory unit 122 may be used herein to refer to any of memory units 122A-H or a similar memory unit).

Figure 4:
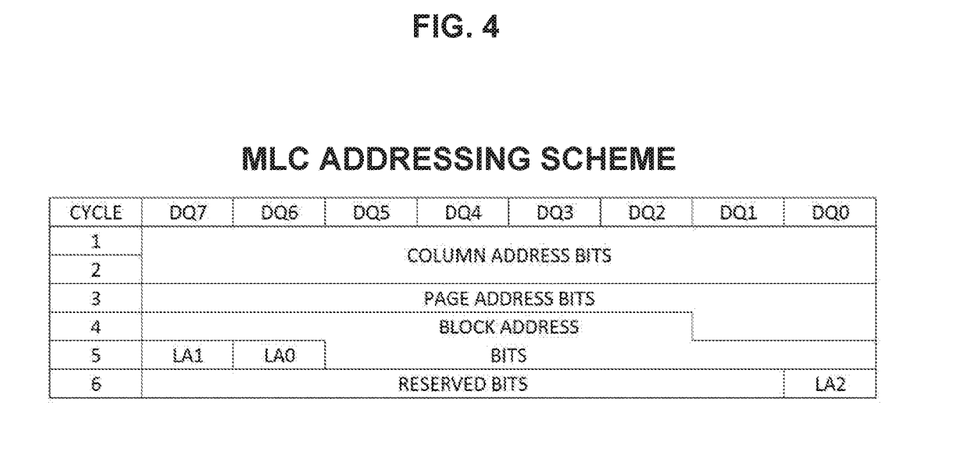
FIG. 4 illustrates an example addressing scheme for a multi-level cell (MLC) NAND flash memory unit in accordance with certain embodiments.
Figure 5:
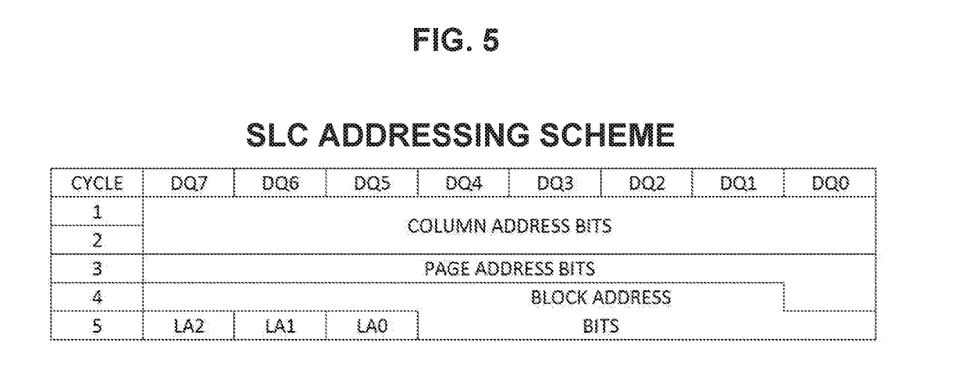
FIG. 5 illustrates an example addressing scheme for a single-level cell (SLC) NAND flash memory unit in accordance with certain embodiments.

When a storage device 106A powers up, a discovery routine which triggers an initialization procedure on each memory device 116 of the storage device may be performed. If the initialization of a memory device 116 is successful, then each memory unit 122 of that memory device is configured with a particular addressing scheme. As one example, if a memory unit 122 is a NAND flash memory unit (as used herein, a memory unit 122 comprising NAND flash memory may be referred to as a NAND flash memory unit), the memory unit may be configured with a MLC, TLC, or QLC addressing scheme (an example of an MLC addressing scheme is depicted in FIG. 4). The initialization of a memory device 116 is not successful if at least one memory unit 122 of that memory device failed to initialize. Each memory unit 122 that did not initialize may be configured with a default addressing scheme. For example, the memory unit may be configured with an SLC addressing scheme (an example of an SLC addressing scheme is depicted in FIG. 5).

A group of memory units 122 may share the same enable signal (e.g., chip enable signal CE1, CE2, or CE3) that is activated when the storage device controller 118 sends a communication to a memory unit 122 of the group. To allow the communication to be consumed by the appropriate memory unit 122 of the group sharing an enable signal, the communication may also include an address of the particular memory unit 122 (e.g., a logical unit number or other identifier for the memory unit that is unique among the group of memory units). However, bus contention (e.g., of a bus that is coupled to each memory unit 122 and the storage device controller 118) can result if the bits used to express the memory unit addresses are not aligned in the different addressing schemes used. For example, memory units 122 that have passed initialization may implement an MLC addressing scheme and memory units 122 failing initialization default to an SLC addressing scheme. However, when one or more bits of the memory unit address in the SLC addressing scheme are received during a different cycle or on a different signal line than one or more bits of the memory unit address in the MLC addressing scheme (i.e., the bits are misaligned), a failing memory unit and a passing memory unit may both determine that a communication is meant for them. Accordingly, both memory units may respond to the communication, resulting in erroneous results. In some systems (e.g., when the storage device 106 is unable to determine which particular memory unit(s) failed), such situations may lead to all memory units that share an enable signal, all memory units of a particular memory device 116, or the entire storage device (e.g., drive) being deemed unusable and taken offline.

Various embodiments of the present disclosure may change the addressing schemes implemented by the failing memory units to match the addressing schemes implemented by the passing memory units in order to align the memory unit address bits to avoid bus contention. Various embodiments of the present disclosure may provide technical advantages, such as increasing the storage capacity of a storage device by allowing isolation of failing memory units, reducing the error rate of a storage device, and other technical advantages.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106A coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106A to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other device) of computer system 100.

In various embodiments, a system memory device 107 may include a memory comprising any number of memory modules, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106A may store any suitable data, such as data used by processor 108 to provide functionality of computer system 100. For example, data associated with programs that are executed or files accessed by cores 114 may be stored in storage device 106. Thus, in some embodiments, a storage device 106A may function as a system memory that stores data and/or sequences of instructions that are executed or otherwise executed by the cores 114. In various embodiments, a storage device 106A may store persistent data (e.g., a user's files or software application code) that remains stored even after power to the storage device 106A is removed. A storage device 106A may be dedicated to CPU 102 or shared with other devices (e.g., another CPU or other device) of computer system 100.

In the embodiment depicted, storage device 106A includes a storage device controller 118 and two memory devices 116 each comprising a four memory units 122 operable to store data, however, a storage device may include any suitable number of memory units or memory units 122. A memory unit 122 includes a plurality of memory cells that are each operable to store one or more bits. The cells of a memory unit 122 may be arranged in any suitable fashion, such as in rows (e.g., wordlines) and columns (e.g., bitlines), three dimensional structures, or other manner. In various embodiments, the cells may be logically grouped into banks, blocks, subblocks, wordlines, pages, frames, bytes, or other suitable groups. In various embodiments, a memory unit 122 comprises one or more NAND flash memory arrays. NAND flash memory arrays are described in more detail in connection with FIG. 2.

A memory unit 122 may include any of the volatile or non-volatile memories listed above or other suitable memory. In particular embodiments, memory unit 122 includes non-volatile memory, such as planar or 3D NAND flash memory. In particular embodiments, a memory unit 122 with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices 106 that implement such standards may be referred to as DDR-based interfaces. For example, a storage device 106A comprising NAND flash memory may receive a command that has a format compliant with a DDR-based standard and may translate the command into one or more commands that are compatible with NAND flash memory of the storage device 106. Similarly, the storage device 106A may format results from operations performed on the NAND flash memory into a format that is compliant with a DDR-based standard before transmitting the results to the CPU 102.

In a particular embodiment, a memory device 116 is a semiconductor package. In various embodiments, a semiconductor package may comprise a casing comprising one or more semiconductor dies (also referred to as chips). A package may also comprise contact pins or leads used to connect to external circuits. In a particular embodiment, each memory unit 122 is embodied on its own die. Accordingly, in some embodiments, a memory device 116 may be a package that includes a plurality of dies that each include a memory unit 122. However, a package is merely one example of a form a memory device 116 may take as a memory device may be any suitable arrangement of one or more memory units 122 and associated logic in any suitable physical arrangement. For example, although a single physical package may include a single memory device 116, multiple memory devices 116 could be resident on a single package or a memory device 116 could be spread across multiple packages. As another example, a memory device 116 may be embodied in one or more different physical mediums, such as a circuit board, die, disk drive, other medium, or any combination of thereof (or combination with one or more packages). Similarly, a die is merely one example of a memory unit 122, as a memory unit 122 may be any suitable arrangement of memory cells and logic associated with the memory cells. For example, although a single die may include a single memory unit 122, multiple memory units 122 could be resident on a single die or a memory unit could be spread across multiple dies. As another example, a memory unit 122 may be embodied in one or more different physical mediums, such as a circuit board, package, disk drive, other medium, or any combination of thereof (or combination with one or more dies).

Storage device 106A may comprise any suitable type of memory and are not limited to a particular speed, technology, or form factor of memory in various embodiments. For example, a storage device 106A could be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106A may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106A may also include a communication interface to communicate with CPU memory controller 112 or I/O controller 110 in accordance with any suitable logical device interface specification such as NVMe, AHCI, or other suitable specification. In particular embodiments, storage device 106A may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory device 116 (or memory unit(s) thereon), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory device 116 such that particular blocks are not written to more than other blocks. In various embodiments, controller 118 may also monitor various characteristics of the storage device 106A such as the temperature or voltage and report associated statistics to the CPU 102. Storage device controller 118 can be implemented on the same board or device as a memory device 116 or on a different board, or device. For example, in some environments, storage device controller 118 may be a centralized storage controller that manages memory operations for multiple different memory devices 116 (which could each be of the same type of memory or could be of different types) of computer system 100 (and thus could provide storage device controller functionality described herein to any of the memories to which it is coupled).

In various embodiments, the storage device 106A also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a computing host coupled to the storage device 106A) and the physical address space of the memory devices 116 of the storage device 106A (which may or may not be exposed to the computing host). The logical address space may expose a plurality of logical groups of data which are physically stored on corresponding physical groups of memory addressable through the physical address space of the storage device 106A. A physical address of the physical address space may comprise any suitable information identifying a physical memory location (e.g., a location within a memory of a memory device 116) of the storage device 106A, such as an identifier of the memory device on which the physical memory location is located, an identifier of the memory unit 122 on which the physical memory location is located (i.e., a memory unit address) one or more pages of the physical memory location, one or more subblocks of the physical memory location, one or more wordlines of the physical memory location, one or more bitlines of the physical memory location, or other suitable identifiers or encodings thereof.

The address translation engine 120 or other portion of storage device 106A may include any suitable memory type for storing logical to physical mapping structures and other information and any suitable logic for changing values stored in the logical to physical mapping structures and other information (e.g., in response to a request from the storage device controller 118) and reading values from the logical to physical mapping structures and other information (e.g., to provide the values to the storage device controller 118 for use in memory operations).

Storage media for the logical to physical mapping structures and other information may be included within the address translation engine 120 and/or storage device controller 118 or may be communicably coupled to the address translation engine and/or storage device controller. In various embodiments, storage media for the logical to physical mapping structures and other information may be integrated on the same package or chip as the storage device controller 118 and/or address translation engine 120 or may be implemented on a separate package or chip.

In various embodiments, the address translation engine 120 and/or storage device controller 118 may provide wear leveling through management of the address mappings of the logical to physical mapping structures and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In various embodiments, the storage device 106A also includes program control logic 124 which is operable to control the programming sequence performed when data is written to or read from a memory device 116. In various embodiments, program control logic 124 may provide the various voltages that applied to the memory cells during the programming and/or reading of one or more pages of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory device 116 and/or memory units 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106A may be located on a single chip or on multiple chips. In various embodiments a storage device 106A and a computing host (e.g., CPU 102) may be located on the same circuit board or on the same device and in other embodiments the storage device 106A and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106A may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
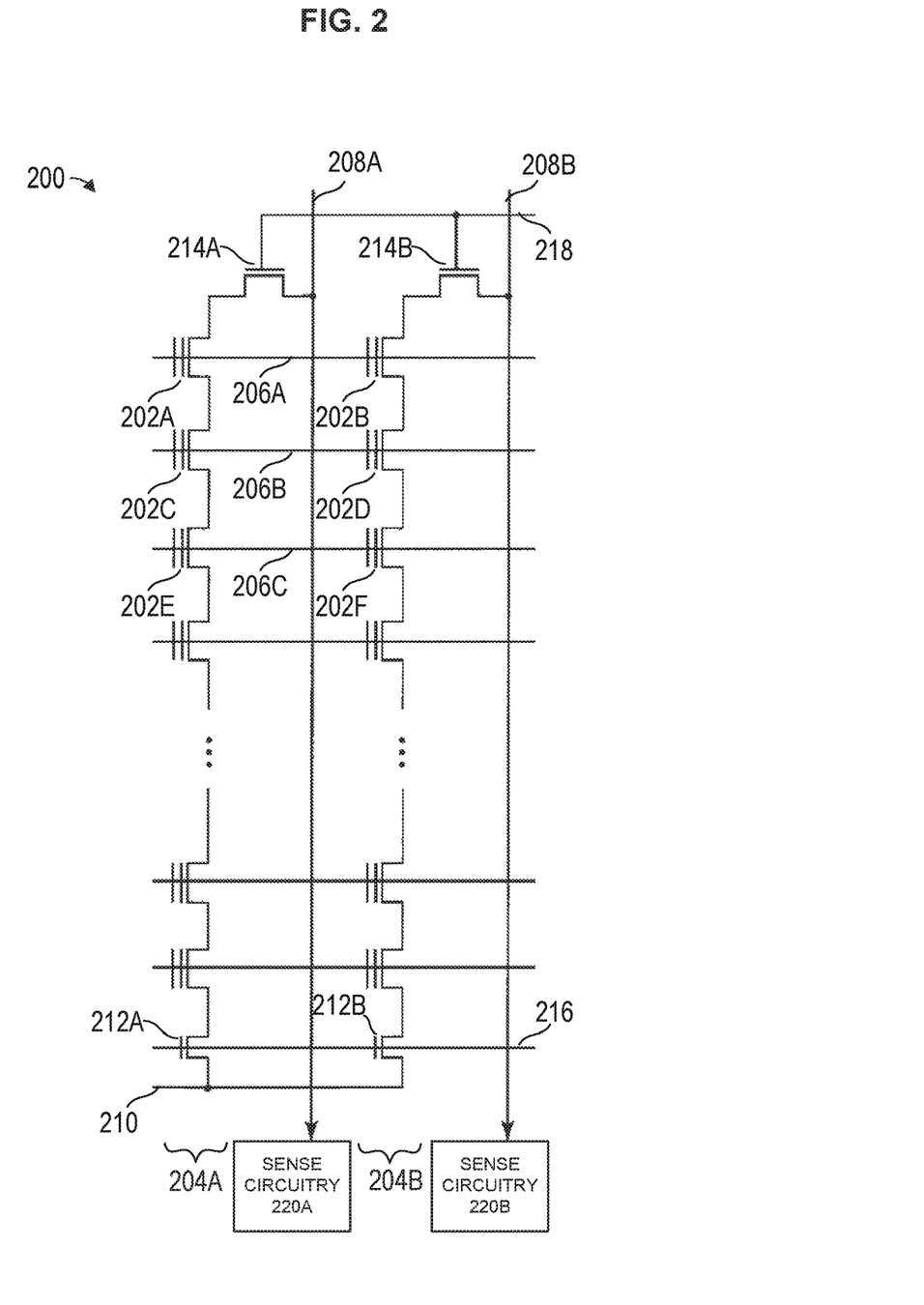
FIG. 2 illustrates an example diagram of a portion of a NAND flash memory array in accordance with certain embodiments.

FIG. 2 illustrates an example diagram of a portion of a NAND flash memory array 200 in accordance with certain embodiments. In various embodiments, a memory unit 122 may comprise one or more NAND flash memory arrays. NAND flash memory array 200 may comprise a plurality of non-volatile memory cells 202 arranged in columns such as series strings 204. In various embodiments, a memory cell 202 may comprise a transistor with a floating gate that stores charge indicative of one or more bit values stored by the memory cell 202. In the series strings 204, the drains of the cells 202 are each (with the exception of the top cell) coupled to a source of another cell 202.

The array 200 also includes wordlines 206. A wordline 206 may span across multiple series strings 204 (e.g., a wordline may be coupled to one memory cell of each series string 204) and are connected to the control gates of each memory cell 202 of a row of the array 200 and used to bias the control gates of the memory cells 202 in the row. The bitlines 208 are each coupled to a series string 204 by a drain select gate 214 and sensing circuitry 220 that detects the state of each cell by sensing voltage or current on a particular bitline 208.

Each series string 204 of memory cells is coupled to a source line 210 by a source select gate 212 and to an individual bitline 208 by a drain select gate 214. The source select gates 212 are controlled by a source select gate control line 216 and the drain select gates 214 are controlled by a drain select gate control line 218.

Figure 3:
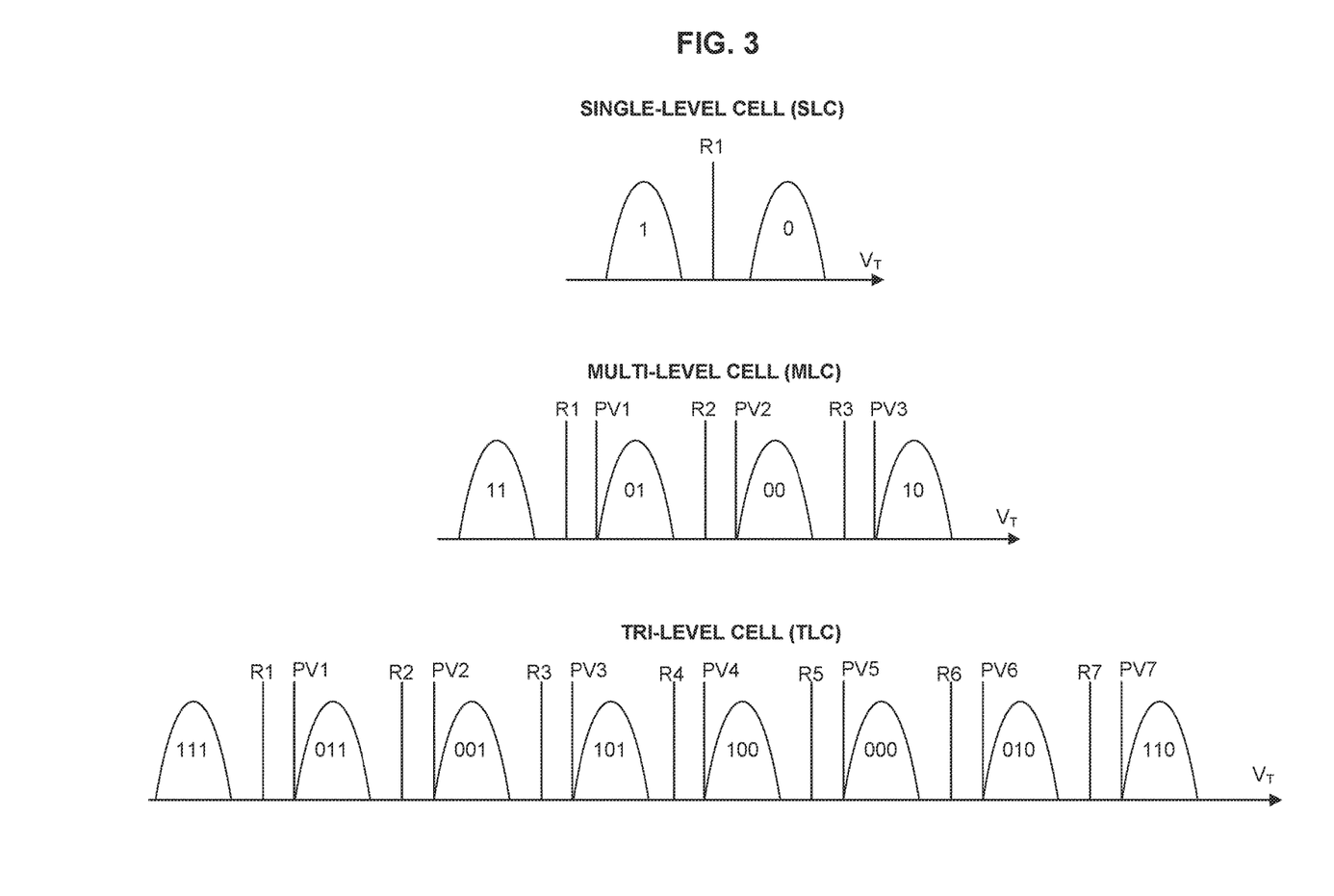
FIG. 3 illustrates example encoding schemes for NAND flash memory cells in accordance with certain embodiments.

In various embodiments, each memory cell 202 can be programmed according to an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels.

When data (e.g., one or more pages) is written to memory device 116, a plurality of the cells may be programmed to a first program level, a plurality of the cells may be programmed to a second program level, and so on.

The various R voltage values depicted in FIG. 3 (e.g., R1, R2, R3, ... ) represent read voltages that may be applied to a wordline when the values of the cells are being read. When a particular read voltage is applied, sense circuitry 220 may determine whether the threshold value of a cell is greater than or less than the read voltage based on a voltage or current sensed by the sense circuitry 220 via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell to determine whether the threshold voltage of the cell has reached its desired level.

In particular embodiments, cells may be programmed a page at a time, where a page is stored in a group of cells that are coupled to the same wordline. For example, the group of cells may be identified by a particular wordline and a particular subblock. As another example, the group of cells may represent all of the cells of the wordline. The group of cells may store one page of data (if the cells are encoded according to an SLC scheme) or multiple pages of data (if the cells are encoded according to an MLC, TLC, QLC, or other multi-level encoding scheme).

In various embodiments, storage device 106A may undergo an initialization procedure, e.g., in response to power up of the storage device 106A or other suitable event. The initialization procedure may involve a series of tests of components of the storage device. In various embodiments, during an initialization procedure, the storage device controller 118 (or other logic of storage device 106A) may instruct each memory device (e.g., 116A, 116B) of the storage device 106A to test its memory units. Each memory device then tests its memory units and reports back to the storage device controller 118 as to whether any initialization errors occurred.

In some embodiments, during the initialization procedure, the storage device controller 118 may instruct a memory device 116 as to which encoding scheme (e.g., SLC, MLC, TLC, QLC) should be configured on the memory units 122 of the memory device 116. In one embodiment, configuration information (e.g., encoding scheme and/or addressing scheme) for a memory unit 122 is written to a memory array of the memory unit 122. During the initialization procedure, each memory unit may run a series of tests to determine whether the memory unit has initialized properly. As one example, the memory unit 122 may attempt to read the configuration information that was written to the memory array of the memory unit 122 and provide the information to control logic of the memory device in which the memory unit is located. If the read is unsuccessful, it is determined that the memory unit 122 was unable to configure itself according to the configuration information (since the information cannot be read properly) and the memory unit has failed initialization. In various embodiments, control logic of a memory device 116 may determine whether the read was successful. The control logic may communicate with each memory unit 122 of the memory device to determine whether each memory unit 122 initialized properly.

In various embodiments, if the configuration of the particular encoding scheme was unsuccessful on a particular memory unit 122, then that memory unit may be configured according to a default encoding scheme and/or associated addressing scheme. In various embodiments, the configuration may be performed by the memory unit 122 and/or control logic of the associated memory device 116. In a particular embodiment, when a memory unit 122 fails initialization, the memory unit is configured according to an SLC encoding scheme and an SLC addressing scheme, although in other embodiments, the memory unit may be configured according to any suitable encoding scheme and/or addressing scheme.

When a memory unit 122 is configured according to a particular encoding scheme, the memory unit may be configured according to an addressing scheme associated with that encoding scheme. For example, logic of a memory unit 122 that couples to a bus (over which instructions are sent to various memory units 122) may be configured to parse instructions sent over the bus according to the addressing scheme. In various embodiments, the addressing scheme specifies how the individual memory units (and locations within the memory units) are to be addressed. For example, the addressing scheme may specify what data is going to be sent on each of a plurality of signal lines of the bus and when (e.g., which cycle) such data is going to be sent.

FIG. 4 illustrates an example addressing scheme for a multi-level cell (MLC) NAND flash memory unit (e.g., a memory unit 122 that is configured according to an MLC encoding scheme) in accordance with certain embodiments. In the depicted addressing scheme, the address information of a command is provided over eight address lines (DQ0:DQ7) over six different clock cycles (although in other embodiments, the address information may be provided over any suitable number of clock cycles, such as five). During the first cycle, all eight address lines each include one column address bit (e.g., a voltage or current state on an address line represents the value of the respective bit); during the second cycle, all eight address lines each include a different column address bit (accordingly the addressing scheme contemplates sixteen column address bits); during cycle three all eight address lines each include a page address bit; during cycle four, address lines DQ0 and DQ1 each include a page address bit and address lines DQ2:DQ7 each include a block address bit; during cycle 5, address lines DQ0:DQ5 each include a block address bit and address lines DQ6 and DQ7 each include a memory unit address bit (depicted here as a logical unit address bits); during cycle 6, address line DQ0 includes a memory unit address bit and address lines DQ1:DQ7 are reserved (for any suitable information).

Some system configurations may include multiple memory units 122 that share a common enable signal that is activated when an instruction is sent to one of the memory units of the group. For example, in the embodiment depicted in FIG. 1, memory units 122A-D share a chip enable signal (CE1); memory units 122E-F share a chip enable signal (CE2), and memory units 122G-H share a chip enable signal (CE3). In such embodiments, when a command is sent (e.g., by storage device controller 118) to a particular memory unit (e.g., memory unit 122A), the appropriate enable signal (i.e., CE1) may be activated and the command may include an address identifying the particular memory unit 122A. In the embodiment depicted in FIG. 4, the address identifying the particular memory unit 122A is the logical unit address that is sent during the fifth cycle (over DQ6 and DQ7) and the sixth cycle (over DQ0). Thus, in this embodiment, a logical unit corresponds to a memory unit 122. Each memory unit 122 within a group of memory units that share the same enable signal may be assigned a different logical unit address (e.g., "000", "001", "010", etc.) and a memory unit (e.g., 122A) may determine that a command sent via the bus is meant for the memory unit when the enable signal (e.g., CE1) is activated and the logical unit address bits of the command equal the logical unit address of the particular memory unit.

FIG. 5 illustrates an example addressing scheme for a single-level cell (SLC) NAND flash memory unit (e.g., a memory unit 122 that is configured according to an SLC encoding scheme) in accordance with certain embodiments. As depicted, the SLC addressing scheme is different from the MLC addressing scheme. While cycles 1-4 are roughly equivalent (with one less page address bit and one more block address bit in cycle 4 of the SLC addressing scheme of FIG. 5), during cycle 5, all three logical unit address bits are sent (via DQ5:DQ7), and the SLC addressing scheme does not include a sixth cycle.

The logical unit address bits of the MLC addressing scheme do not align with the logical unit address bits of the SLC addressing scheme. That is, at least one bit differs (as to cycle and/or address line). In this case, none of the three logical unit address bits align, since LA1 is sent on DQ7 in the MLC addressing scheme but on DQ6 in the SLC addressing scheme; LA0 is sent on DQ6 in the MLC addressing scheme but on DQ5 in the SLC addressing scheme; and LA2 is sent in a completely different cycle (and signal line) in the two addressing schemes.

In various embodiments, problems may arise during operation among memory units that share the same enable signal if the logical unit address bits do not align (e.g., due to memory units that share the enable signal being configured with different addressing schemes). This may lead to more than one memory unit (which may include a memory unit that failed initialization and a memory unit that passed initialization) responding to the same command from the storage device controller 118 (or other logic issuing commands to the memory units), leading to errors during operation.

As an example, if memory unit 122B has a logical unit address of 001 and is configured with the MLC addressing scheme of FIG. 4 and memory unit 122C has a logical unit address of 010 and is configured with the SLC addressing scheme of FIG. 5 (e.g., because memory unit 122C failed initialization), at some point during operation a command may be sent to the memory unit 122B. In conjunction with transmission of the command, an enable signal (CE1) common to both memory unit 122B and memory unit 122C is activated, resulting in both memory units analyzing the command to determine whether the command is addressed to them (other memory units sharing the enable signal such as memory unit 122A and memory unit 122D may also analyze the command). Because the command is addressed to memory unit 122B with address 001; during the sixth cycle the LA2 bit on DQ0 is set to a 0 value (e.g., DQ0 may be pulled low), and during the fifth cycle the LA1 bit on DQ7 is set to a 0 value (e.g., DQ7 may be pulled low) and the LA0 bit on DQ6 is set to a 1 value (e.g., DQ6 may be pulled high). During the transmission of the command, there is a possibility that DQ5 is pulled low during the fifth cycle (e.g., either that bit in the block address is 0 or the command does not include a block address and that bit is not set but for any of various reasons DQ5 is in a low voltage state during the fifth cycle). Memory unit 122B will analyze the command and correctly determine that the command is addressed to itself, since the command has an address of 001. Memory unit 122C also analyzes the command and determines that LA2 is 0 (the value of DQ7 during the fifth cycle), LA1 is 1 (the value of DQ6 during the fifth cycle), and LA0 is 0 (the value of DQ5 during the fifth cycle). Accordingly, memory unit 122C determines that the command is addressed to itself, since it incorrectly determines the command has an address of 010. In response to this command, memory unit 122B and 122C may each respond by placing data on a bus, but the data placed on the bus by 122C may interfere with the data placed on the bus by memory unit 122B, leading to an erroneous response to the storage device controller 118.

Various embodiments of the present disclosure may avoid this problem by providing a scheme to align the address bits of the memory units 122 that share a common enable signal. In various embodiments, in response to receiving an indication that one or more memory units 122 of a memory device 116 failed initialization, all of the memory units of that memory device 116 may be configured to the same addressing scheme (e.g., the addressing scheme that passing memory units are configured with).

Figure 6:
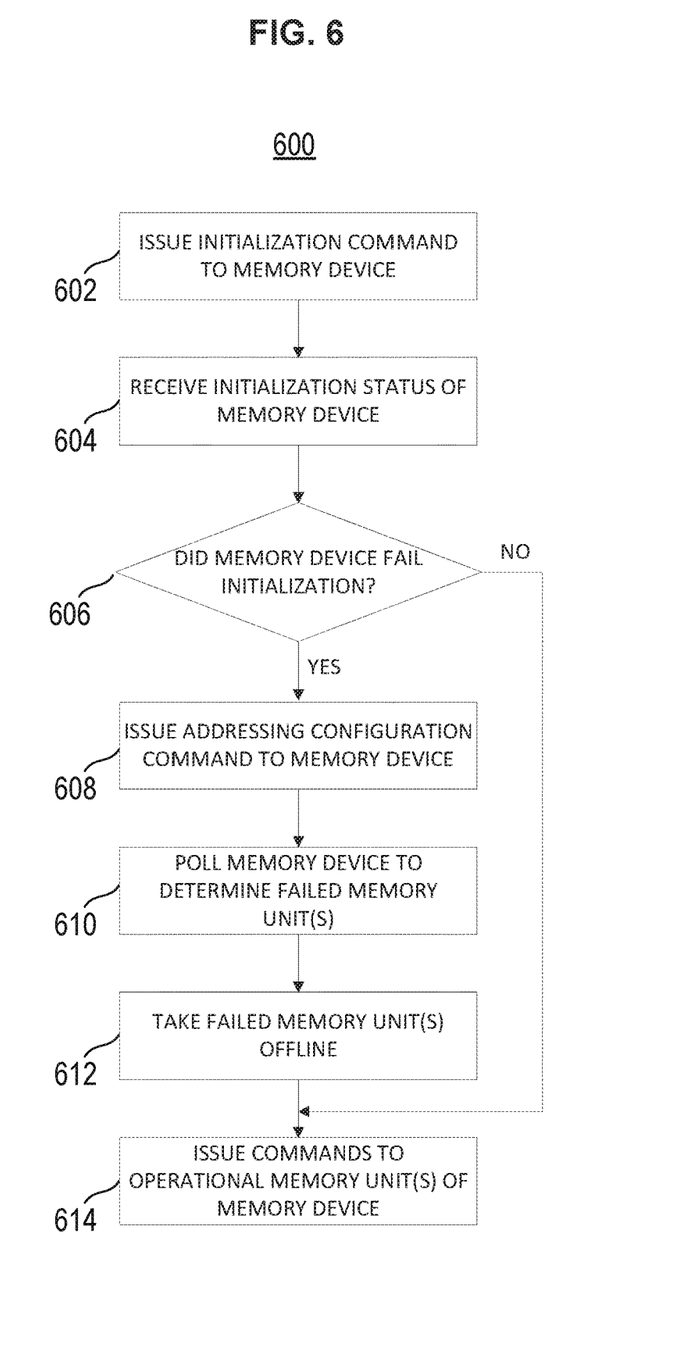
FIG. 6 illustrates an example flow for synchronizing addressing configuration in accordance with certain embodiments.

FIG. 6 illustrates an example flow for synchronizing addressing configuration in accordance with certain embodiments. The flow 600 depicts example operations that may be performed by any suitable logic, such as a storage device controller 118, a memory device 116, and/or a memory unit 122. Although the flow is explained with respect to a single memory device 116, the flow may be performed an any number of memory devices of storage device 106A.

At 602, an initialization command is issued to a memory device 116. In one embodiment, storage device controller 118 may send initialization commands to each memory device 116 of the storage device. In other embodiments, a memory device 116 may automatically perform an initialization procedure in response to any suitable trigger (such as the powering up of the memory device, the resetting of the memory device, receiving an initialization command from another entity, or other suitable event). In a particular embodiment, an initialization command (or other command sent in association with an initialization command) may include configuration information for the memory unit(s) 122 of a memory device 116. Any suitable configuration information may be sent, such as a specification of a single encoding scheme to be applied to each memory unit of a memory device (or an indication of a respective encoding scheme for each individual memory unit of the memory device).

An initialization procedure may involve any suitable operations by a memory device 116 and/or its memory units 122 to determine whether each memory unit 122 of the memory device initialized properly. For example, during an initialization procedure, configuration information for a particular memory unit 122 may be loaded into a memory array of the memory unit 122 and then read. If the configuration details are not read correctly (e.g., if a parity test fails), then the memory unit 122 is considered to have failed initialization. A memory device 116 (e.g., via control logic of the memory device) may determine whether any of its memory units 122 failed initialization. In a particular embodiment, a memory device may determine whether any memory units 122 failed initialization on a per-enable signal basis. For example, memory device 116B may determine whether any memory units coupled to CE2 failed initialization and may separately determine whether any memory units coupled to CE3 failed initialization.

At 604, the initialization status of a memory device is received. In one embodiment, storage device controller 118 may poll each memory device for its initialization results. If the memory device does not respond or responds with an indication that initialization is not yet complete, the storage device controller 118 may poll the memory device again after a predetermined amount of time. In some embodiments, the memory device 118 may send its initialization status to the storage device controller in response to completion of the initialization procedure (e.g., without receiving a request from the storage device controller 118). In a particular embodiment, an initialization status may indicate whether any memory units 122 of the memory device 116 failed initialization. In another embodiment, an initialization status of a memory device 116 may indicate, for each enable signal coupled to the memory device 116, whether any memory units 122 coupled to that enable signal failed initialization. In some embodiments, an initialization status may indicate that a memory unit of the memory device (or a memory unit coupled to a particular enable signal) failed during initialization, but does not specify which particular memory unit(s) failed during initialization. In other embodiments, the initialization status may indicate which particular memory unit(s) failed during initialization.

At 606, a determination is made as to whether a memory device 116 failed initialization. A memory device 116 may be determined to have failed initialization if one or more of the memory units 122 of the memory device failed initialization. In a particular embodiment, this determination is made by the storage device controller 118 based on an initialization status reported by the memory device. If the memory device passed initialization (i.e., all memory units 122 of the memory device passed initialization), the flow may move to 614 where various commands (e.g., read, program, erase commands) may be issued to the memory units of the memory device over the course of operation.

If it is determined at 606 that the memory device failed initialization, an addressing configuration command is issued to the memory device at 608. In one embodiment, storage device controller 118 issues the addressing configuration command. In a particular embodiment, an addressing configuration command specifies an indication of an addressing scheme that is to be implemented by all memory units 122 of the memory device. The indication of the addressing scheme could be an explicit specification of an address scheme or it could be an encoding scheme (from which the addressing scheme may be inferred). In another embodiment, an addressing configuration command may specify an indication of an addressing scheme that is to be implemented by all memory units 122 of a memory device that are coupled to the same enable signal (e.g., if a memory device is coupled to two enable signals and a memory unit 122 coupled to one of those enable signals fails initialization, the addressing configuration command may apply only to the memory units 122 coupled to that enable signal).

The addressing scheme indicated in the addressing configuration command may be determined in any suitable manner. In a particular embodiment, the storage device controller 118 may store an indication of which encoding scheme is to be implemented by the passing memory units of the memory device 116 (indeed, in some embodiments storage device controller 118 instructed the memory device to configure its memory units according to the encoding scheme during initialization and thus may store an indication of the encoding scheme) and the addressing configuration command may indicate the corresponding addressing command. In other embodiments, the indicated addressing scheme may be a default addressing scheme, such as an SLC addressing scheme, an MLC addressing scheme, a TLC addressing scheme, or a QLC addressing scheme.

In a first example scenario, when the memory device 116 is instructed during initialization to configure its memory units according to an MLC encoding scheme, the passing memory units of the memory device are placed into an MLC encoding scheme (and an MLC addressing scheme is implemented by these memory units), but failing memory units are placed into (or left in) a default encoding scheme, such as an SLC encoding scheme (and an SLC addressing scheme is implemented by these memory units). In a second example scenario, when the memory device is instructed to configure its memory units according to an TLC encoding scheme, the passing memory units of the memory device are placed into an TLC encoding scheme (and an TLC addressing scheme is implemented by these memory units), but failing memory units are placed into (or left in) a default encoding scheme, such as an SLC encoding scheme (and an SLC addressing scheme is implemented by these memory units). In a third example scenario, when the memory device is instructed to configure its memory units according to a QLC encoding scheme, the passing memory units of the memory device are placed into an QLC encoding scheme (and an QLC addressing scheme is implemented by these memory units), but failing memory units are placed into (or left in) a default encoding scheme, such as an SLC encoding scheme (and an SLC addressing scheme is implemented by these memory units). In various embodiments, the default encoding scheme (and/or addressing scheme) could be something other than SLC, such as MLC, TLC, or other encoding scheme (and its associated addressing scheme).

As described above, in a particular embodiment, the addressing configuration command may specify that all memory units of the memory device should be configured to the addressing scheme corresponding to the encoding scheme that is implemented by the memory units that passed initialization. Accordingly, in the first example scenario, the addressing configuration command may indicate that all memory units of the memory device should implement an MLC addressing scheme. In the second example scenario, the addressing configuration command may indicate that all memory units of the memory device should implement a TLC addressing scheme. In the third example scenario, the addressing configuration command may indicate that all memory units of the memory device should implement a QLC addressing scheme.

In various embodiments, the addressing configuration command may be received by control logic of a memory device 116, and the control logic may communicate with each memory unit 122 (to which the command applies) to cause each memory unit to implement the addressing scheme indicated by the addressing configuration command. In other embodiments, the addressing configuration command may be received from the storage device controller 118 at each memory unit (e.g., each memory unit may be configured to listen for such a command when an enable signal common among the memory units is activated). In response to the addressing configuration command, each memory unit of the memory device implements the indicated addressing scheme. In various embodiments, the addressing configuration command may not explicitly specify an addressing scheme, but may indicate that the memory units are to implement a default addressing scheme (e.g., the memory units may be preconfigured with the default addressing scheme and may implement the default addressing scheme in response to receiving the addressing configuration command).

In a particular embodiment, before sending the addressing configuration command, the storage device controller 118 may determine whether the addressing configuration command should be sent. This may involve determining whether the addressing scheme that is implemented on the passing memory unit(s) is the same as the default addressing scheme that is implemented on the failing memory unit(s). For example, if the passing memory units are to be configured with an SLC addressing scheme, then storage device controller 118 may determine that the addressing scheme of the units does not need to be changed and may forego the sending of the addressing configuration command and move to 610 of the flow. However, if the storage device controller 118 determines that the addressing scheme of the passing unit(s) is different from the addressing scheme of failing unit(s), the storage device controller 118 may issue the addressing configuration command.

At 610, the memory device is polled to determine which memory unit(s) failed initialization. In some embodiments, this may include sending a message to each memory unit 122 of a memory device 116 that failed initialization (or to each memory unit 122 of a group of memory units coupled to the same enable signal when the group fails initialization) to determine which memory unit(s) failed initialization. Since all memory units are configured according to the same addressing scheme at this point, each memory unit is individually addressable and the danger of multiple memory units responding to the same request is alleviated so the failing memory unit(s) can be accurately ascertained.

At 612, the failed memory unit(s) of the memory device are taken offline. For example, the failed memory unit(s) may be powered down and the storage device controller may store an indication that the failed memory unit(s) are not available. At 614, normal operation of the memory device proceeds as various commands (e.g., read, program, erase commands) may be issued to the passing memory unit(s) of the memory device.

The flow described in FIG. 6 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 6 may be repeated, combined, modified or deleted where appropriate. Additionally, operations may be performed in any suitable order without departing from the scope of particular embodiments.

Figure 7:
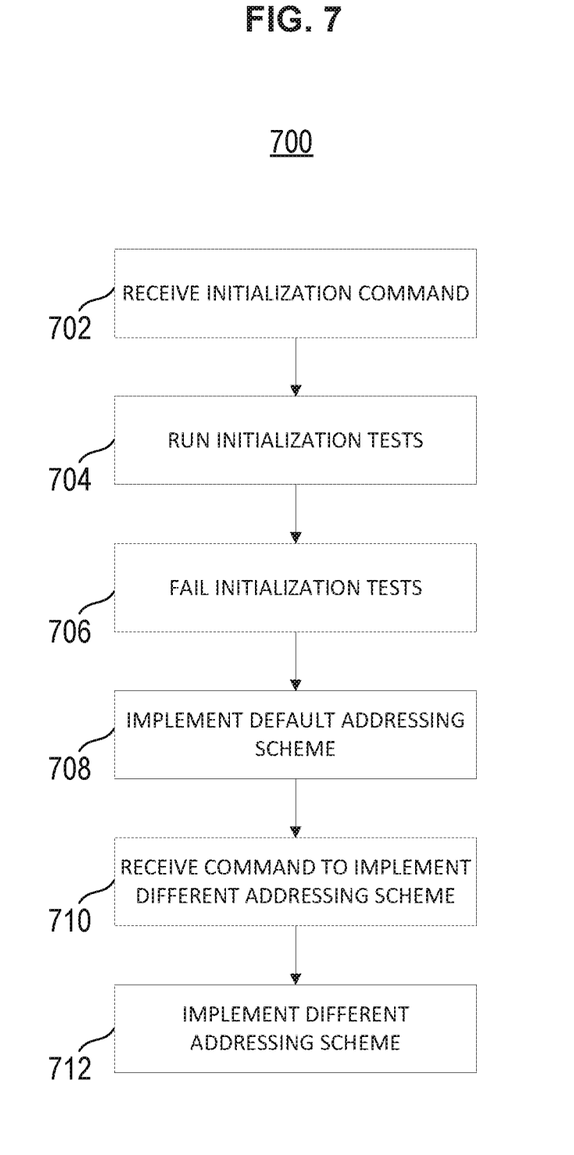
FIG. 7 illustrates an example flow for changing an addressing scheme in accordance with certain embodiments.

FIG. 7 illustrates an example flow for changing an addressing scheme in accordance with certain embodiments. The flow 700 depicts example operations that may be performed by any suitable logic, such as a memory device 116 and/or memory unit 122.

At 702, an initialization command is received. As various examples, the command may be received at control logic of a memory device 116 from a storage device controller 118, at a memory unit 122 from a storage device controller 118, or at a memory unit 122 from control logic of a memory device 116.

At 704, initialization tests are run in response to the initialization command (or in response to any other suitable event). Initialization tests may be run on each memory unit of a memory device and the results may be accessed by control logic of a memory device. The initialization tests may involve testing various memory cells to determine whether a memory unit is functioning properly. For example, one or more initialization tests may indicate whether a memory unit has been properly configured to an assigned encoding scheme and its associated addressing scheme.

At 706, a memory unit fails initialization tests. At 708, the memory unit implements a default addressing scheme (or the memory unit could remain in a default state with a default addressing scheme). In various embodiments, the default addressing scheme is different from an addressing scheme that would have been implemented if the memory unit had passed the initialization tests.

At 710, a command to implement a different addressing scheme is received. As various examples, the command may be received at control logic of a memory device 116 from a storage device controller 118, at a memory unit 122 from a storage device controller 118, or at a memory unit 122 from control logic of a memory device 116. In various embodiments, the command may specify the particular addressing scheme to implement. In other embodiments, the memory unit may be preconfigured to determine the addressing scheme to implement in response to a command to implement a different addressing scheme (e.g., the addressing scheme may be stored in logic of the memory unit). In such embodiments, the command may not explicitly specify the addressing scheme to implement. At 712, the addressing scheme of the failed memory unit is changed. As the flow 700 may be formed on all memory units that share the same enable signal with the particular memory unit, all of the memory units may now implement the same addressing scheme, avoiding bus contention issues arising from misaligned addressing schemes.

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order without departing from the scope of particular embodiments.

Although various embodiments have been described with respect to particular encoding schemes (e.g., MLC, TLC, QLC), the teachings of such embodiments may be equally applicable to memories using any suitable encoding levels, including encoding schemes that become feasible in the future.

Furthermore, even though some embodiments are generally discussed with reference to NAND flash, the teachings of the disclosure may be used with any type of non-volatile or volatile memory (such as those types described herein or other types) that perform initialization procedures and have programmable addressing schemes.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106A, system memory device 107, memory devices 116, memory units 122, storage device controller 118, address translation engine 120, program control logic 124, sense circuitry 220, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a storage device comprising a NAND flash memory device comprising a plurality of NAND flash memory units, the storage device to determine that the NAND flash memory device did not pass an initialization procedure; identify a first addressing scheme that is implemented by one or more of the NAND flash memory units that initialized properly; and after the initialization procedure, instruct each of the plurality of NAND flash memory units to implement the first addressing scheme.

In an embodiment, the NAND flash memory units are each coupled to the same enable signal. In an embodiment, a first NAND flash memory unit of the plurality of NAND flash memory units is to implement the first addressing scheme in response to initializing properly. In an embodiment, a first NAND flash memory unit of the plurality of NAND flash memory units is to implement, prior to being instructed to implement the first addressing scheme after the initialization procedure, a second addressing scheme when the first NAND flash memory unit fails to initialize properly. In an embodiment, at least one bit that is used to specify a logical unit number address of one of the plurality of NAND flash memory units is specified differently in the first addressing scheme and the second addressing scheme. In an embodiment, the first addressing scheme specifies address bits over six cycles and the second addressing scheme specifies address bits over five cycles. In an embodiment, the first addressing scheme is a multi-level cell (MLC) addressing scheme and the second addressing scheme is a single-level cell (SLC) addressing scheme. In an embodiment, the NAND flash memory device is embodied in a semiconductor package and each of the plurality of NAND flash memory units is embodied within a respective die of the package. In an embodiment, a storage device controller of the storage device is to instruct each of the plurality of NAND flash memory units to implement the first addressing scheme in response to determining that the NAND flash memory device did not initialize properly. In an embodiment, the storage device is further to instruct the plurality of NAND flash memory units to implement the first addressing scheme during the initialization procedure. In an embodiment, the storage device is further to communicate with each of the plurality of NAND flash memory units after the NAND flash memory units have been instructed to implement the first addressing scheme to determine one or more of the NAND flash memory units did not initialize properly. In an embodiment, the storage device is further to take offline the one or more of the NAND flash memory units that did not initialize properly.

In at least one embodiment, a method comprises determining that the NAND flash memory device did not pass an initialization procedure, wherein the NAND flash memory device comprises a plurality of NAND flash memory units; identifying a first addressing scheme that is implemented by one or more of the NAND flash memory units that initialized properly; and after the initialization procedure, instructing each of the plurality of NAND flash memory units to implement the first addressing scheme.

In an embodiment, the NAND flash memory units are each coupled to the same enable signal. In an embodiment, a first NAND flash memory unit of the plurality of NAND flash memory units is to implement the first addressing scheme in response to initializing properly. In an embodiment, a first NAND flash memory unit of the plurality of NAND flash memory units is to implement, prior to being instructed to implement the first addressing scheme after the initialization procedure, a second addressing scheme when the first NAND flash memory unit fails to initialize properly. In an embodiment, at least one bit that is used to specify a logical unit number address of one of the plurality of NAND flash memory units is specified differently in the first addressing scheme and the second addressing scheme. In an embodiment, the first addressing scheme specifies address bits over six cycles and the second addressing scheme specifies address bits over five cycles. In an embodiment, the first addressing scheme is a multi-level cell (MLC) addressing scheme and the second addressing scheme is a single-level cell (SLC) addressing scheme. In an embodiment, the NAND flash memory device is embodied in a semiconductor package and each of the plurality of NAND flash memory units is embodied within a respective die of the package. In an embodiment, a storage device controller of a storage device is to instruct each of the plurality of NAND flash memory units to implement the first addressing scheme in response to determining that the NAND flash memory device did not initialize properly. In an embodiment, the method further comprises instructing the plurality of NAND flash memory units to implement the first addressing scheme during the initialization procedure. In an embodiment, the method further comprises communicating with each of the plurality of NAND flash memory units after the NAND flash memory units have been instructed to implement the first addressing scheme to determine one or more of the NAND flash memory units did not initialize properly. In an embodiment, the method further comprises taking offline the one or more of the NAND flash memory units that did not initialize properly. In an embodiment, a system comprises means to perform any of the above methods. In an embodiment, the means comprise machine-readable code that when executed, cause a machine to perform one or more steps of the methods. In an embodiment, the system comprises a battery communicatively coupled to a processor, a display communicatively coupled to the processor, or a network interface communicatively coupled to the processor.

In at least one embodiment, a system comprises a processor to send a write request to a storage device; and a storage device comprising a NAND flash memory device comprising a plurality of NAND flash memory units; and a storage device controller to determine that the NAND flash memory device did not pass an initialization procedure; identify a first addressing scheme that is implemented by one or more of the NAND flash memory units that initialized properly; and after the initialization procedure, instruct each of the plurality of NAND flash memory units to implement the first addressing scheme.

In an embodiment, a first NAND flash memory unit of the plurality of NAND flash memory units is to implement, prior to being instructed to implement the first addressing scheme after the initialization procedure, a second addressing scheme when the first NAND flash memory unit fails to initialize properly. In an embodiment, at least one bit that is used to specify a logical unit number address of one of the plurality of NAND flash memory units is specified differently in the first addressing scheme and the second addressing scheme. In an embodiment, they system further comprises one or more of a battery communicatively coupled to the processor, a display communicatively coupled to the processor, or a network interface communicatively coupled to the processor.

In at least one embodiment, a system comprises means for determining that a NAND flash memory device did not pass an initialization procedure, the NAND flash memory device comprising a plurality of NAND flash memory units; means for identifying a first addressing scheme that is implemented by one or more of the NAND flash memory units that initialized properly; and means for instructing, after the initialization procedure, each of the plurality of NAND flash memory units to implement the first addressing scheme.

In an embodiment, the NAND flash memory units are each coupled to the same enable signal. In an embodiment, the system further comprises means for implementing, prior to being instructed to implement the first addressing scheme after the initialization procedure, a second addressing scheme at a first NAND flash memory unit of the plurality of NAND flash memory units when the first NAND flash memory unit fails to initialize properly. In an embodiment, at least one bit that is used to specify a logical unit number address of one of the plurality of NAND flash memory units is specified differently in the first addressing scheme and the second addressing scheme. In an embodiment, the system further comprises means for communicating with each of the plurality of NAND flash memory units after the NAND flash memory units have been instructed to implement the first addressing scheme to determine one or more of the NAND flash memory units did not initialize properly.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a storage device comprising a NAND flash memory device comprising a plurality of NAND flash memory units, the storage device to:
  determine that the NAND flash memory device did not pass an initialization procedure;
  identify a first addressing scheme that is implemented by one or more of the NAND flash memory units that initialized properly; and
  after the initialization procedure, instruct each of the plurality of NAND flash memory units to implement the first addressing scheme;
wherein a first NAND flash memory unit of the plurality of NAND flash memory units is to implement, prior to being instructed to implement the first addressing scheme after the initialization procedure, a second addressing scheme when the first NAND flash memory unit fails to initialize properly.

2. The apparatus of claim 1, wherein the NAND flash memory units are each coupled to the same enable signal.

3. The apparatus of claim 1, wherein a first NAND flash memory unit of the plurality of NAND flash memory units is to implement the first addressing scheme in response to initializing properly.

4. The apparatus of claim 1, wherein at least one bit that is used to specify a logical unit number address of one of the plurality of NAND flash memory units is specified differently in the first addressing scheme and the second addressing scheme.

5. The apparatus of claim 1, wherein the first addressing scheme specifies address bits over six cycles and the second addressing scheme specifies address bits over five cycles.

6. The apparatus of claim 1, wherein the first addressing scheme is a multi-level cell (MLC) addressing scheme and the second addressing scheme is a single-level cell (SLC) addressing scheme.

7. The apparatus of claim 1, wherein the NAND flash memory device is embodied in a semiconductor package and each of the plurality of NAND flash memory units is embodied within a respective die of the semiconductor package.

8. The apparatus of claim 1, wherein a storage device controller of the storage device is to instruct each of the plurality of NAND flash memory units to implement the first addressing scheme in response to determining that the NAND flash memory device did not initialize properly.

9. The apparatus of claim 1, the storage device further to instruct the plurality of NAND flash memory units to implement the first addressing scheme during the initialization procedure.

10. The apparatus of claim 1, the storage device further to communicate with each of the plurality of NAND flash memory units after the NAND flash memory units have been instructed to implement the first addressing scheme to determine one or more of the NAND flash memory units did not initialize properly.

11. The apparatus of claim 10, the storage device further to take offline the one or more of the NAND flash memory units that did not initialize properly.

12. A method comprising:
determining that a NAND flash memory device did not pass an initialization procedure, the NAND flash memory device comprising a plurality of NAND flash memory units;
identifying a first addressing scheme that is implemented by one or more of the NAND flash memory units that initialized properly; and
after the initialization procedure, instructing each of the plurality of NAND flash memory units to implement the first addressing scheme;
wherein a first NAND flash memory unit of the plurality of NAND flash memory units is to implement, prior to being instructed to implement the first addressing scheme after the initialization procedure, a second addressing scheme when the first NAND flash memory unit fails to initialize properly.

13. The method of claim 12, wherein the NAND flash memory units are each coupled to the same enable signal.

14. The method of claim 12, wherein at least one bit that is used to specify a logical unit number address of one of the plurality of NAND flash memory units is specified differently in the first addressing scheme and the second addressing scheme.

15. A system comprising:
a processor to send a write request to a storage device; and
a storage device comprising:
a NAND flash memory device comprising a plurality of NAND flash memory units; and
a storage device controller to:
determine that the NAND flash memory device did not pass an initialization procedure;
identify a first addressing scheme that is implemented by one or more of the NAND flash memory units that initialized properly; and
after the initialization procedure, instruct each of the plurality of NAND flash memory units to implement the first addressing scheme; wherein a first NAND flash memory unit of the plurality of NAND flash memory units is to implement, prior to being instructed to implement the first addressing scheme after the initialization procedure, a second addressing scheme when the first NAND flash memory unit fails to initialize properly.

16. The system of claim 15, wherein at least one bit that is used to specify a logical unit number address of one of the plurality of NAND flash memory units is specified differently in the first addressing scheme and the second addressing scheme.

17. The system of claim 15, further comprising one or more of: a battery communicatively coupled to the processor, a display communicatively coupled to the processor, or a network interface communicatively coupled to the processor.

* * * * *